US012684854B2

(12) United States Patent     (10) Patent No.:   US 12,684,854 B2

Chiu et al.     (45) Date of Patent:     Jul. 14, 2026

(54) INTERCONNECT STRUCTURE HAVING A MULTI-DECK CONDUCTIVE FEATURE AND METHOD OF FORMING THE SAME

(71) Applicant: Taiwan Semiconductor Manufacturing Co., Ltd., Hsin-Chu (TW)

(72) Inventors: Shih-Chuan Chiu, Hsinchu (TW); Chia-Hao Chang, Hsinchu City (TW); Cheng-Chi Chuang, New Taipei City (TW); Chih-Hao Wang, Hsinchu County (TW); Yu-Ming Lin, Hsinchu City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 906 days.

(21) Appl. No.: 17/814,998

(22) Filed: Jul. 26, 2022

(65) Prior Publication Data

US 2022/0367663 A1     Nov. 17, 2022

Related U.S. Application Data

(62) Division of application No. 16/901,749, filed on Jun. 15, 2020.

(51) Int. Cl.
    *H10D 64/66*     (2025.01)
    *H10D 30/62*     (2025.01)
    (Continued)

(52) U.S. Cl.
    CPC .......... *H10D 64/666* (2025.01); *H10D 30/62* (2025.01); *H10D 30/6219* (2025.01);
    (Continued)

(58) Field of Classification Search
CPC .. H10D 30/024; H10D 30/62; H10D 84/0158; H10D 84/0135; H10D 30/6219;
(Continued)

(56) References Cited

U.S. PATENT DOCUMENTS 8,772,109 B2 *   7/2014   Colinge ............ H01L 21/30625
                                              438/269
8,785,285 B2    7/2014   Tsai et al.
(Continued)

FOREIGN PATENT DOCUMENTS

| CN | 110660732 | 1/2020 |
| CN | 113161321 | 7/2021 |
| KR | 10-2014-0121634 | 10/2014 |

*Primary Examiner* — Mary A Wilczewski

(74) *Attorney, Agent, or Firm* — HAYNES AND BOONE, LLP

(57) ABSTRACT

The present disclosure provides a semiconductor device structure that includes: a fin active region extruded above a semiconductor substrate; a gate stack disposed on the fin active region, wherein the gate stack includes a gate dielectric layer and a gate electrode; source/drain (S/D) features formed on the fin active region and interposed by the gate stack; and a conductive feature electrically connected to the gate electrode or the S/D features. The conductive feature includes a bottom metal feature of a first metal; a top metal feature of a second metal over the bottom metal feature, wherein the second metal is different from the first metal in composition; a barrier layer surrounding both the top metal feature and the bottom metal feature; and a liner surrounding both the top metal feature and separating the top metal feature from the bottom metal feature and the barrier layer.

20 Claims, 10 Drawing Sheets

(51) Int. Cl.
| | |
|---|---|
| *H10D 84/01* | (2026.01) |
| *H10D 84/03* | (2025.01) |
| *H10W 20/41* | (2026.01) |

(52) U.S. Cl.
CPC ..... *H10D 84/0135* (2025.01); *H10D 84/0158* (2025.01); *H10D 84/038* (2025.01); *H10W 20/425* (2026.01)

(58) Field of Classification Search
CPC .......... H10D 84/0149; H10W 20/033; H10W 20/036; H10W 20/037; H10W 20/0372; H10W 20/056; H10W 20/0595; H10W 20/425; H10W 20/43; H10W 20/438
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 * | 9/2014 | Wang ................ H01L 21/76831 |
| | | | 257/745 |
| 8,860,148 | B2 | 10/2014 | Hu et al. |
| 9,105,490 | B2 * | 8/2015 | Wang ................ H01L 21/76856 |
| 9,236,267 | B2 | 1/2016 | De et al. |
| 9,236,300 | B2 | 1/2016 | Liaw |
| 9,331,161 | B1 | 5/2016 | Lee et al. |
| 9,520,482 | B1 | 12/2016 | Chang et al. |
| 9,576,814 | B2 | 2/2017 | Wu et al. |
| 9,716,063 | B1 * | 7/2017 | Edelstein .......... H01L 21/76849 |
| 2005/0093168 | A1 * | 5/2005 | Tsumura .......... H01L 21/76879 |
| | | | 257/E21.585 |
| 2007/0181946 | A1 * | 8/2007 | Mathew ................. H10D 30/62 |
| | | | 257/E29.281 |
| 2009/0243116 | A1 * | 10/2009 | Feustel ............. H01L 21/76877 |
| | | | 257/773 |
| 2013/0302974 | A1 | 11/2013 | Hahn et al. |
| 2014/0110755 | A1 * | 4/2014 | Colinge ........... H01L 21/02381 |
| | | | 257/E21.409 |
| 2015/0097246 | A1 | 4/2015 | Xie et al. |
| 2019/0088742 | A1 * | 3/2019 | Zang ................. H01L 21/76897 |
| 2019/0164827 | A1 * | 5/2019 | Yang ................. H01L 21/76877 |
| 2020/0006230 | A1 * | 1/2020 | Tsai ...................... H01L 23/535 |
| 2020/0335594 | A1 * | 10/2020 | Zang ................. H10D 84/0147 |
| 2021/0233861 | A1 | 7/2021 | Chang et al. |
| 2021/0391438 | A1 | 12/2021 | Chiu et al. |
| 2021/0391455 | A1 * | 12/2021 | Lin .................... H10D 84/0135 |
| 2024/0153868 | A1 * | 5/2024 | Motoyama ......... H10W 20/056 |

* cited by examiner 220
221
218
216
212

402

214
210
114

220
221
218
216
212

402

222

214

210

114

Y
Z
X

220

221

218

216

212

222

402

224

214

210

114

Y

Z

X 220
221
218
216
212

226
222

224
214
210
114

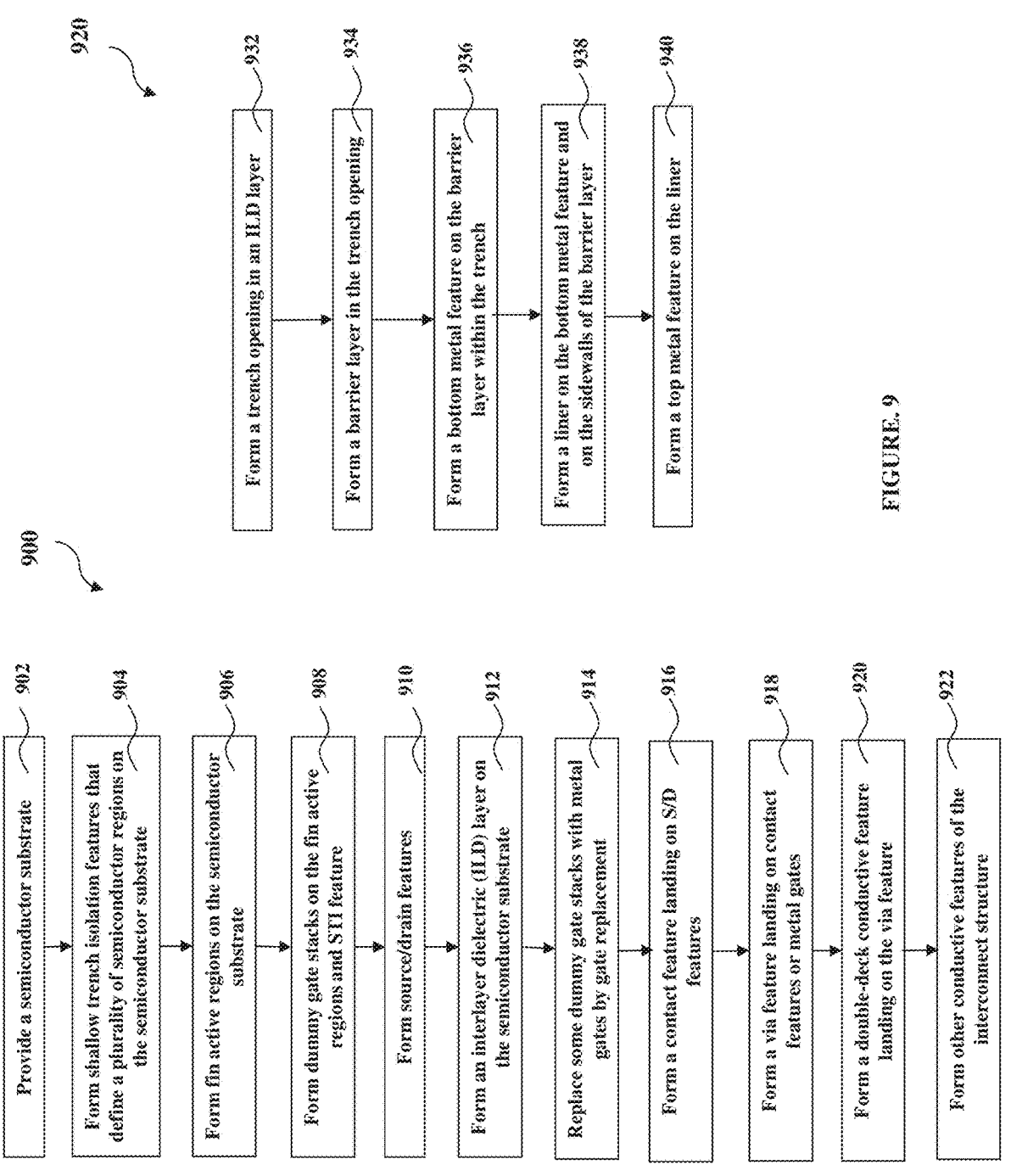

920

932 Form a trench opening in an ILD layer

934 Form a barrier layer in the trench opening

936 Form a bottom metal feature on the barrier layer within the trench

938 Form a liner on the bottom metal feature and on the sidewalls of the barrier layer 940 Form a top metal feature on the liner

902 Provide a semiconductor substrate

904 Form shallow trench isolation features that define a plurality of semiconductor regions on the semiconductor substrate 906 Form fin active regions on the semiconductor substrate 908 Form dummy gate stacks on the fin active regions and STI feature 910 Form source/drain features 912 Form an interlayer dielectric (ILD) layer on the semiconductor substrate 914 Replace some dummy gate stacks with metal gates by gate replacement 916 Form a contact feature landing on S/D features 918 Form a via feature landing on contact features or metal gates 920 Form a double-deck conductive feature landing on the via feature 922 Form other conductive features of the interconnect structure

INTERCONNECT STRUCTURE HAVING A MULTI-DECK CONDUCTIVE FEATURE AND METHOD OF FORMING THE SAME

PRIORITY

This is a divisional application of and claims priority to U.S. application Ser. No. 16/901,749, filed Jun. 15, 2020, which is herein incorporated by reference in its entirety.

BACKGROUND

The semiconductor integrated circuit (IC) industry has experienced exponential growth. Technological advances in IC materials and designs have produced generations of ICs, with each generation having smaller and more complex circuits than the previous generation. In the course of IC evolution, functional density (e.g., the number of interconnected devices per chip area) has generally increased while feature size (e.g., the smallest component, or line, that can be created using a fabrication process) has decreased.

Despite advances in materials and fabrication techniques, scaling of planar devices, such as metal-oxide-semiconductor field effect transistor (MOSFET) devices, has proven challenging. To overcome these challenges, non-planar transistors have been developed, examples being fin-like field effect transistors (FinFETs) and gate-all-around (GAA) transistors. Advantages of non-planar transistors include reduced short-channel effect, reduced current leakage, and higher current flow. To further improve the performance of such non-planar transistors, there has been a push towards the use of high-mobility channels. As an example, a silicon germanium alloy is a promising channel material because of its high-carrier mobility. The transistor scaling also has challenges in an interconnect structure, including the resistance and RC delay. For example, various conductive features, such as contacts, vias or metal lines, of the interconnect structure have smaller dimensions, causing high contact resistance. Conventional conductive features also include a barrier layer, which further reduces the dimensions of the contacts holes. Furthermore, metal filling is another challenge on concerns, such as voids or other defects.

Therefore, although existing devices and the interconnect structure have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9 is a flowchart of a method making the semiconductor device structure, in accordance with various embodiments.

DETAILED DESCRIPTION

Figure 1:
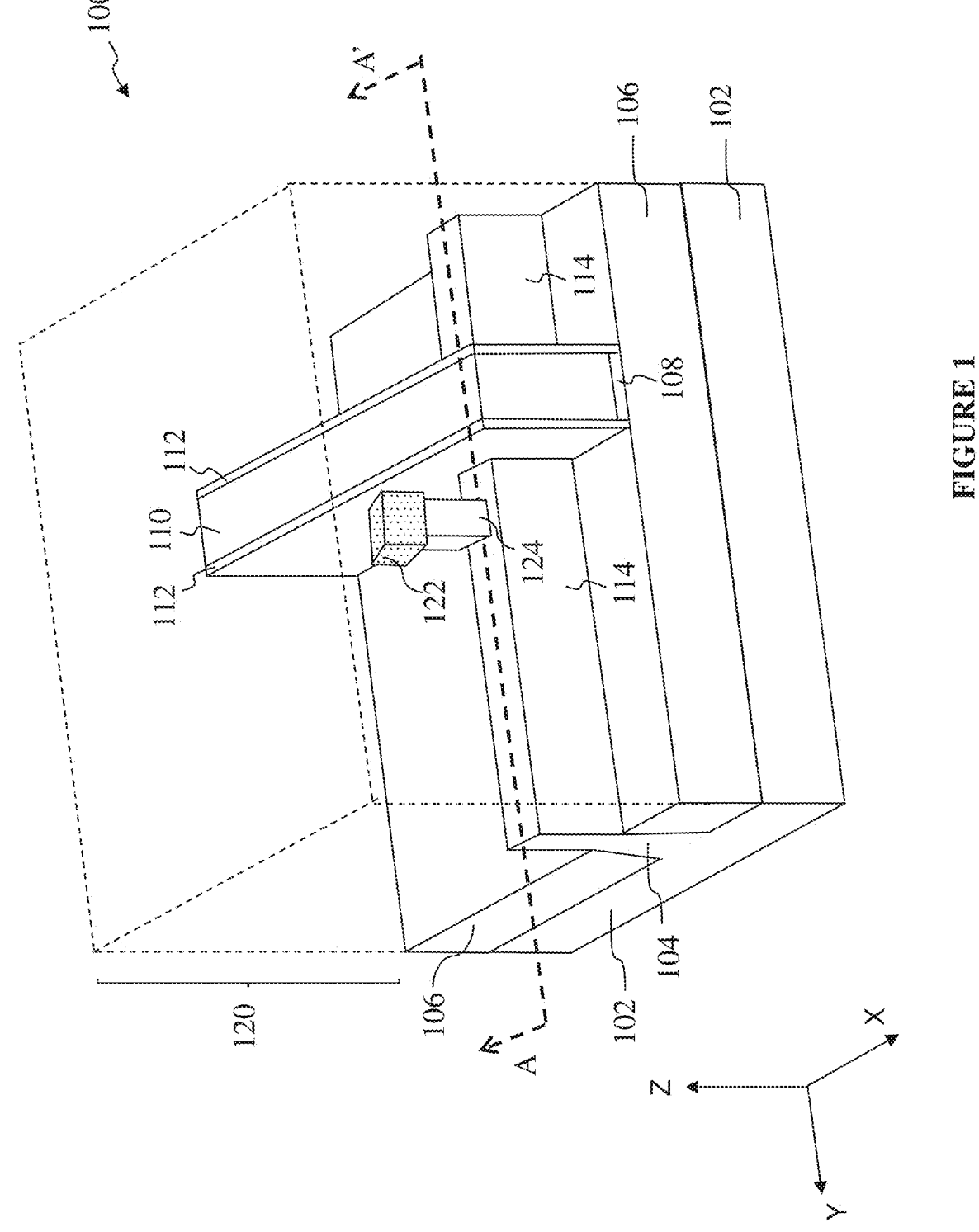
FIG. 1 shows a three-dimensional view of a semiconductor device structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three major categories: front-end-of-line (FEOL), middle-end-of-line (MEOL), and back-end-of-line (BEOL). FEOL generally encompasses processes related to fabricating IC devices, such as transistors. For example, FEOL processes may include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. For example, BEOL processes may include forming multilayer interconnect features that facilitate operation of the IC devices. Such multilayer interconnect features may include contacts, insulating layers (dielectrics), metal levels, and bonding sites for chip-to-package connections. The present disclosure explores the structure of an interconnect element and methods of forming the interconnect element during a MEOL process and/or a BEOL process for improved IC device performance. In particular, the present disclosure proposes a structure of the metal-zero ($M_0$) and a method making the same. The interconnect structure includes metal lines distributed in multiple metal layers ($M_0$, $M_1$, $M_2$, . . . from the bottom to the top) to provide horizontal routing, vias distributed between metal layers to provide vertical routing, and contacts to provide connection between the overlying conductive features (such as vias) and device features (such as a gate, a source and a drain of a transistor). Effects of the interconnect structure has reduced resistance, increased adhesion and barrier effect, and improved gas filling.

FIG. 1 illustrates a three-dimensional view of a semiconductor device structure 100, in accordance with an embodiment. In the example of FIG. 1, the semiconductor device structure 100 includes a fin-like field effect transistor (Fin-FET) device and an interconnect structure 120 formed on the FinFET device. The interconnect structure 120 electrically connect the FinFET device and other devices (such as other FinFET devices and/or capacitors) into a functional circuit. The interconnect structure 120 includes various conductive features, especially a multi-deck conductive feature 122. A multi-deck conductive feature 122 is electrically connected to a device feature of the FinFET device through underlying conductive features 124 (such as a contact and a via) and electrically connected to overlying conductive features (such as metal lines and vias) to provide electrical signal or power to the corresponding S/D feature 114. Other conductive features of the interconnect structure 120 are not shown in FIG. 1 for the sake of clarity and simplicity. The FinFET device of FIG. 1 may be fabricated in a FEOL process, while the contact features may be formed in a MEOL process. In some embodiments, the semiconductor device structure 100 may be included or may be a part of an integrated circuit (IC) device. Exemplary IC devices include static random-access memory (SRAM) and/or other logic circuits. The semiconductor device structure 100 may be electrically and/or communicatively coupled to passive components (e.g., resistors, capacitors, and/or inductors) and/or other active components (e.g., p-type field effect transistors (pFETs), n-type FETs (nFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells). The present disclosure is not limited to any particular number of devices or device regions, or to any particular device configurations.

The semiconductor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor. The substrate 102 may, in some examples, include a semiconductor-on-insulator substrate, such as Si-on-insulator (SOI), SiGe-on-insulator (SGOI), Ge-on-insulator (GOI) substrates.

The semiconductor device structure 100 also includes one or more fin structures 104 (e.g., Si fins) that extend from the substrate 102. Only one fin structure 104 is shown in FIG. 1 for the sake of clarity and simplicity. The fin structure 104 may be formed using any suitable method. For example, the fin structure 104 may be formed using one or more photolithography processes, including double-patterning or multi-patterning processes. Generally, multi-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fin structure 104 is formed may be used to form active devices through subsequent processing and are thus referred to as active regions.

The semiconductor device structure 100 includes isolation features 106, which may be shallow trench isolation (STI) features. In some examples, the formation of the isolation features 106 includes etching trenches into the substrate 102 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 106. The isolation features 106 may have a multi-layer structure such as a thermal oxide liner layer over the substrate 102 and a filling layer (e.g., silicon nitride or silicon oxide) over the thermal oxide liner layer. Alternatively, the isolation features 106 may be formed using any other isolation formation techniques. As illustrated in FIG. 1, a lower portion of the fin structure 104 is surrounded by the isolation features 106, and an upper portion of the fin structure 104 protrudes from the isolation features 106. In other words, a portion of the fin structure 104 is embedded in the isolation features 106. The isolation features 106 prevents electrical interference or crosstalk between adjacent transistor devices.

The semiconductor device structure 100 further includes a gate stack structure that engages a channel region of the fin structure 104. The gate stack structure includes a gate dielectric layer 108 and a gate electrode 110. Spacers 112 are formed on opposite sidewalls of the gate stack structure. In one example, the gate electrode 110 is a metal-containing gate electrode, and the gate dielectric layer 108 is a high-k dielectric material.

Figure 2A:
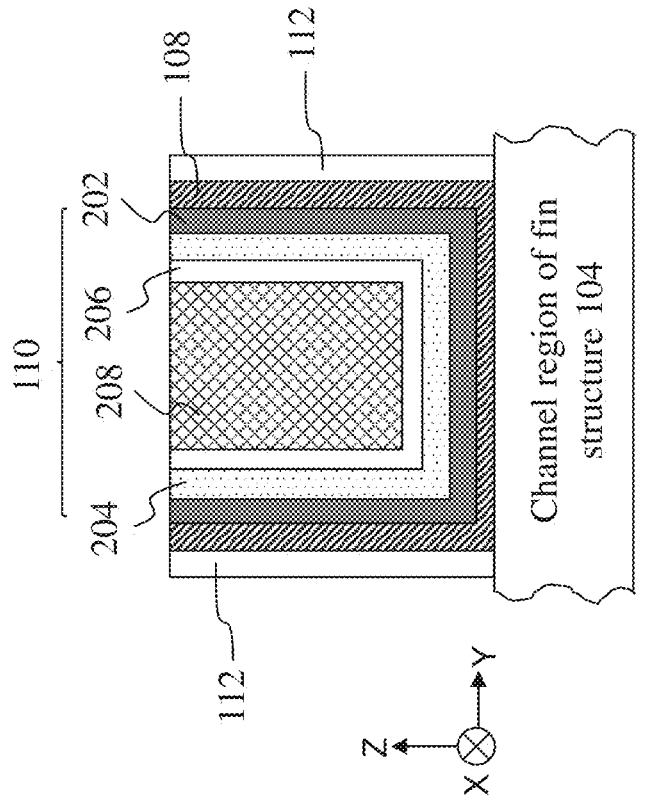
FIGS. 2A-2B show cross-sectional views of a gate stack structure and a multi-deck conductive feature, respectively, in accordance with various embodiments.

In a further example, the gate electrode 110 is a metal gate electrode, and the gate dielectric layer 108 is a high-k dielectric layer 108. In such embodiments, the gate stack structure may further include a capping layer 202, a work function layer 204, a seed layer 206, and a filling metal layer 208, as seen in FIG. 2A. It is noted that FIG. 2A is a cross-sectional view taken along the line A-A' shown in FIG.

1. FIG. 2A also shows the spacers 112 formed on opposite sidewalls of the gate stack structure. In the example of FIG. 2A, the gate dielectric layer 108 may include a dielectric material having a dielectric constant greater than a dielectric constant of $SiO_2$, which is approximately 3.9. For example, the gate dielectric layer 108 may include hafnium oxide ($HfO_2$), which has a dielectric constant in a range from about 18 to about 40. As various other examples, the gate dielectric layer 108 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, metal nitride, or combinations thereof. The gate dielectric layer 108 may be formed by any suitable processes, such as molecular beam deposition (MBD), CVD, PECVD, PVD, ALD, or combinations thereof. The gate dielectric layer 108 may further include an interfacial layer, such as silicon oxide, formed between the channel region of the fin structure 104 and the high-k dielectric layer.

The capping layer 202 is formed on the gate dielectric layer 108 and may include an electrically conductive material such as titanium nitride, although other materials, such as tantalum nitride, titanium, tantalum, or the like, may alternatively be utilized. The capping layer 202 may be formed using a CVD process, such as PECVD. The work function layer 204 is formed over the capping layer 202. In a p-type FinFET device, a p-type work function layer may be used and may include TiN, TaN, Ru, Mo, Al, WN, $ZrSi_2$, $MoSi_2$, $TaSi_2$, $NiSi_2$, WN, other suitable p-type work function materials, or a combination thereof. In an n-type FinFET device, an n-type work function layer may be used and may include Ti, Ag, TaAl, TaAlC, TiAlN, TaC, TaCN, TaSiN, Mn, Zr, other suitable n-type work function materials, or a combination thereof. In some embodiments, the work function layer 204 may be omitted. The seed layer 206 may be formed over the capping layer 202 (or the work function layer 204, if present). The seed layer 206 may include copper (Cu), titanium (Ti), tantalum (Ta), titanium nitride (TiN), tantalum nitride (TaN), the like, or a combination thereof, and may be deposited by ALD, sputtering, physical vapor deposition (PVD), or the like.

The filling metal layer 208 may be formed over the seed layer 206. The filling metal layer 208 includes aluminum, tungsten, copper or other suitable metal. The filling metal layer 208 is deposited by a suitable technique, such as plating, PVD, CVD or ALD. In the stated example where the gate stack structure includes a metal gate electrode over a high-k dielectric layer, the filling metal layer 208 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof.

As shown in FIG. 1, spacers 112 are formed on opposite sidewalls of the gate stack structure. The spacers 112 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The spacers 112 may include a single layer or a multi-layer structure. In some embodiments, the spacers 112 may be formed by depositing a spacer layer (containing the dielectric material) over the gate electrode 110, followed by an anisotropic etching process to remove portions of the spacer layer from the top surfaces of gate electrode 110. After the etching process, portions of the spacer layer on the sidewall surfaces of the gate electrode 110 substantially remain and become the spacers 112. In some embodiments, the anisotropic etching process is a dry (e.g. plasma) etching process. Additionally or alternatively, the formation of the spacers 112 may also involve chemical oxidation, thermal oxidation, ALD, CVD, and/or other suitable methods.

The semiconductor device structure 100 further includes source/drain (S/D) features 114 that are disposed on opposite sides of the gate stack structure. The S/D features 114 may include any suitable semiconductor materials and may be formed by any suitable process. For example, the S/D features 114 may be formed by appropriately doping S/D regions of the fin structure 104. The doping processes may include ion implantation process and/or a diffusion process. Additionally or alternatively, the S/D features 114 may be formed by an epitaxial process. For example, the S/D features 114 in an n-type FinFET device may include Si, SiC, SiP, SiAs, SiPC, or combinations thereof; while the S/D features 114 in a p-type FinFET device may include Si, SiGe, Ge, SiGeC, or combinations thereof. The S/D features 114 may be doped in-situ or ex-situ. For example, epitaxially-grown silicon S/D features 114 may be doped with carbon to form silicon:carbon (Si:C) S/D features 114, phosphorous to form silicon:phosphorus (Si:P) S/D features 114, or both carbon and phosphorous to form silicon carbon phosphorus (SiCP) S/D features 114; and the epitaxially grown SiGe S/D features 114 may be doped with boron. One or more annealing processes may be performed to activate the dopants in the S/D features 114. The annealing processes may include rapid thermal annealing (RTA) and/or laser annealing processes.

In some embodiments, the S/D features 114 may include raised S/D features formed by selective epitaxial growth for strain effect with enhanced carrier mobility and device performance. The raised S/D features 114 are formed by one or more epitaxial (epi) processes, whereby Si features, SiGe features, SiC features, and/or other suitable features are grown in a crystalline state on the fin active regions 104. Alternatively, an etching process is applied to recess the S/D regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fin structure 104. In some embodiments, adjacent sources/drains may be grown to merge together to provide increased contact area and reduce the contact resistance. This can be achieved by controlling the epitaxial growth process.

Figure 2B:
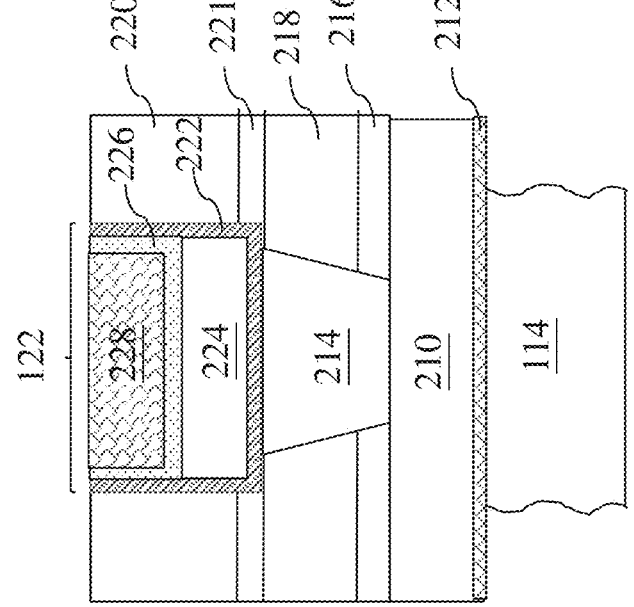
Figure 2B:
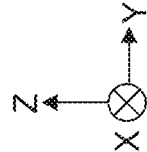

FIG. 2B is a cross-sectional view taken along the line A-A' shown in FIG. 1. As shown in FIG. 2B, various conductive features formed on the S/D feature 114. A contact feature 210 is formed on the S/D feature 114. The contact feature 210 includes a suitable conductive material, such as tungsten (W), cobalt (Co), ruthenium (Ru), or other suitable conductive material, deposited by suitable technique, such as CVD, ALD or PVD. The contact feature 210 may be formed by a procedure that includes forming a contact hole in a dielectric layer by lithography process and etching; depositing one or more conductive material in the contact hole; and performing a chemical mechanical polishing (CMP). The contact feature 210 may further include a barrier layer deposited in the contact hole to separate the contact feature from the surrounding dielectric material. The barrier layer may include tantalum nitride, tantalum, titanium nitride, titanium or a combination thereof. The barrier layer may have a thickness ranging between 1 nm and 5 nm.

7

8

Figure 3:
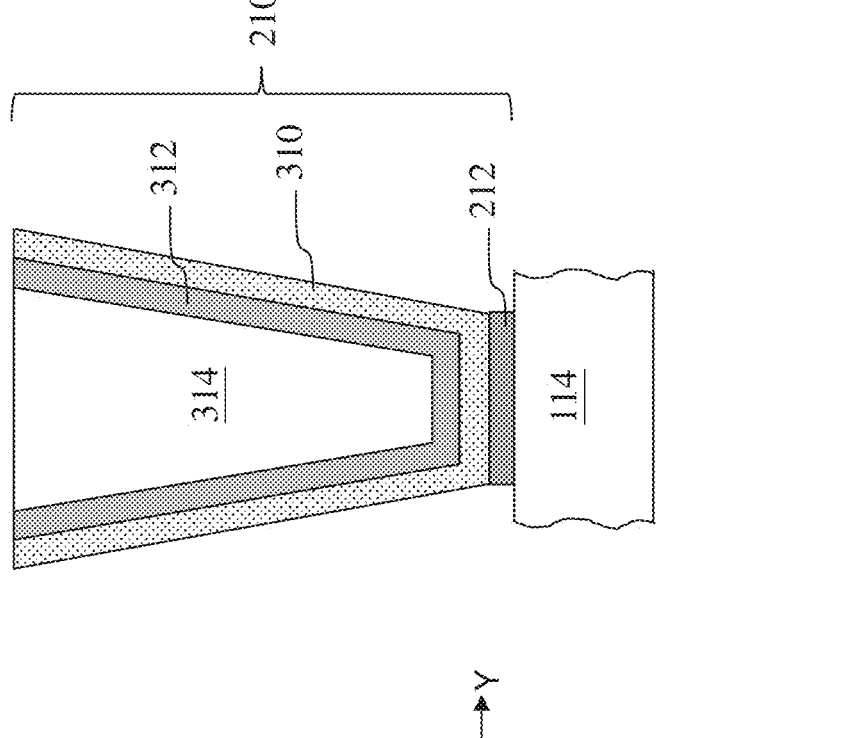
FIG. 3 shows a cross-sectional view of a contact feature, in accordance with various embodiments.

The contact feature 210 is further illustrated in FIG. 3 in a cross-sectional view. The contact feature 210 may have a profile with different widths at the bottom surface and the top surface. The contact feature 210 may be formed by a deposition processes and subsequently a planarization process such as chemical-mechanical polishing (CMP). As seen in the example of FIG. 3, the contact feature 210 includes a silicide layer 212, a barrier layer 310, a seed layer 312, and a conductive core 314. The barrier layer 310 may include an electrically conductive material such as titanium (Ti), titanium nitride (TiN), tantalum (Ta), tantalum nitride (TaN), or the like, and may be formed using a CVD process, such as PECVD. The seed layer 312 may be deposited by PVD, ALD, or CVD, and may be formed of tungsten, copper, or copper alloys. The conductive core 314 may include tungsten, alloys thereof, or compounds thereof, although other suitable materials such as aluminum, copper, platinum, ruthenium, silver, gold, rhodium, molybdenum, nickel, cobalt, cadmium, zinc, alloys of these, combinations thereof, and the like, may alternatively be utilized. In some examples, the conductive core 314 may include a compound or alloy of one or more of the aforementioned materials combined with one or more of zirconium, tin, silver, gold, calcium, beryllium, magnesium, rhodium, sodium, iridium, potassium, indium, osmium, silicon, germanium, and manganese. Any suitable deposition method, such as PVD, CVD, ALD, plating (e.g. electroplating) may be used to form the conductive core 314.

In some embodiments, a dielectric layer may be formed over the fin structure 104 and the isolation features 106, thereby encapsulating the gate stack structure, S/D features 114, and contact features 210. The dielectric layer is not shown in FIGS. 1, 2B and 3 for the sake of simplicity and clarity. The dielectric layer may include silicon oxide, a low-k dielectric material (e.g. a material having a dielectric constant less than the dielectric constant of $SiO_2$, which is approximately 3.9), or other suitable dielectric materials. Some examples of other suitable dielectric materials include phosphosilicate glass (PSG), borosilicate glass (BSG), boron-doped phosphosilicate glass (BPSG), undoped silicate glass (USG), or the like. The dielectric layer may be deposited by any suitable method, such as CVD, PECVD, or FCVD. As stated above, the contact features 210 may be formed in a MEOL process, while other features of the semiconductor device structure 100 may be formed in an FEOL process.

In some embodiment, a via feature 214 is formed on the contact feature 210 and electrically connected to the S/D feature 114 through the contact feature 210. The via feature 214 may have a similar geometry of the contact feature 210 illustrated in FIG. 3. The via feature 214 includes a suitable conductive material, such as tungsten (W); cobalt (Co); ruthenium (Ru); Co, W or Ru-based compound or alloy doped with other element, such as zirconium (Zr), tin (Sn), silver (Ag), copper (Cu), gold (Au), aluminum (Al), calcium (Ca), beryllium (Be), magnesium (Mg), rhodium (Rh), sodium (Na), iridium (Jr), tungsten (W), molybdenum (Mo), zinc (Zn), nickel (Ni), potassium (K), cadmium (Cd), indium (In), Ru, Co, osmium (Os), silicon (Si), germanium (Ge), and manganese (Mn); or other suitable conductive material, deposited by suitable technique, such as CVD, ALD or PVD. The formation of the via feature 214 may include: depositing a contact-etch-stop-layer (CESL) 216; forming an interlayer dielectric (ILD) layer 218; forming an opening in the ILD layer 218; and forming the via feature 214 in the opening. The CESL 216 may include silicon nitride ($Si_3N_4$), silicon oxide ($SiO_2$), silicon oxynitride (SiON), silicon oxycarbide (SiOC), silicon oxycarbonitride (SiOCN), and/or other materials. The CESL 216 may be formed by CVD, ALD or other suitable deposition technique. The ILD layer 218 may include silicon oxide, silicon nitride, silicon carbon oxide, silicon carbon oxynitride, low-k dielectric material or other suitable dielectric material. The ILD layer 218 may be formed by deposition and CMP. The deposition of the ILD layer 218 may include a suitable deposition technique, such as flowable CVD (FCVD). The Via feature 214 may further include a barrier layer (such as tantalum nitride, tantalum, titanium nitride, titanium or a combination thereof) deposited in the via opening to separate the via feature from the surrounding ILD layer. The barrier layer may have a thickness ranging between 1 nm and 5 nm. In some examples, the via feature 214 has a via height ranging between 5 nm and 100 nm and a via width ranging between 5 nm and 50 nm.

The multi-deck conductive feature 122 is further formed on the via feature 214 and electrically connected to the S/D features 114 through the contact feature 210 and the via feature 214, and further connected to external conductive features. Alternatively, the multi-deck conductive feature 122 is directly formed on the contact feature 210 according to some embodiments. The multi-deck conductive feature 122 may have a width ranging between 5 nm and 400 nm. In the present embodiment, the multi-deck conductive feature 122 is a metal line of a lowest metal layer (also referred to as Mo), formed during the MEOL process. The multi-deck conductive feature 122 is formed in another ILD layer 220, similar to the ILD layer 218 in terms of composition and formation. In some embodiment, an etch stop layer (ESL) 221 may be deposited before depositing the ILD layer 220. The ESL 221 is similar to the CESL 216 in terms of composition and formation according to some examples. The multi-deck conductive feature 122 is formed in a trench of the ILD layer 220 and has a multi-deck structure. The multi-deck conductive feature 122 includes a barrier layer 222, a bottom metal feature 224, a liner 226 and a top metal feature 228, as illustrated in FIG. 2B.

The bottom metal feature 224 and the top metal feature 228 have different metal compositions so to tune the gap filling capability and the conductivity, respectively. Compared with a single-deck conductive feature, one metal, such as copper, fills in the trench and extends from the top to the bottom, which experiences both gap filling issue and resistance issue due to high aspect ratio of the trench in the advanced technology nodes. In the present embodiment, the top metal feature 228 and the bottom metal feature 224 are chosen with different metal composition and conductivity. Especially, the conductivity of the top metal feature 228 is greater than that of the bottom metal feature 224 according to the present embodiment.

The barrier layer 222 and the liner 226 have different compositions and functions. The barrier layer 222 provides a barrier to prevent metals of the multi-deck conductive feature 122 (such as metals of the top metal feature 228 and the bottom metal feature 224) from diffusing into the dielectric materials, such as the ILD layer 220. The liner 226 provides a wetting surface for metal deposition and enhances the adhesion strength of the metal, such as the top metal feature 228, to the surrounding material, such as the barrier layer 222. Unlike the existing barrier layer combining both functions of the barrier and lining, the barrier layer and liner are separated and configured differently to accommodate the small dimensions and gap filling in the advanced technology nodes. Especially, the barrier layer 222 is eliminated from the interface between the top metal feature 228 and the bottom metal feature 224 with the benefit of conductivity.

In the present embodiment, the barrier layer 222 includes tantalum nitride. In some embodiments, the barrier layer 222 includes tantalum nitride, tantalum, titanium nitride, titanium, or a combination thereof. For example, the barrier layer 222 may include a tantalum nitride film and a tantalum film on the tantalum nitride film. The barrier layer 222 includes a portion directly on the via feature 214. This portion is referred to as an interfacial barrier layer, which may have a thickness ranging between 1 nm and 5 nm.

In the present embodiment, the liner 226 includes cobalt. In some embodiments, the liner 226 includes cobalt; tungsten; ruthenium; copper; Co, W, Ru or Cu-based compound or alloy doped with other element, such as Zr, Sn, Ag, Cu, Au, Al, Ca, Be, Mg, Rh, Na, Ir, W, Mo, Zn , Ni, K , Co, Cd , Ru, In, Os , Si, Ge, Mn; or other suitable conductive material, deposited by PVD, ALD, CVD or other suitable deposition technique. The liner 226 may have a thickness ranging between 0.5 nm and 5 nm.

In the present embodiment, the bottom metal feature 224 includes cobalt. In some embodiments, the bottom metal feature 224 includes cobalt; tungsten; ruthenium; copper; Co, W, Ru or Cu-based compound or alloy doped with other element, such as Zr, Sn, Ag, Cu, Au, Al, Ca, Be, Mg, Rh, Na, Jr, W, Mo, Zn , Ni, K , Co, Cd , Ru, In, Os , Si, Ge, Mn; or other suitable conductive material. The bottom metal feature 224 may have a thickness ranging between 5 nm and 450 nm. The bottom metal feature 224 may be formed by a procedure that includes deposition, CMP and etch back to recess the deposited metal into a desired height.

In the present embodiment, the top metal feature 228 includes copper. In some embodiments, the top metal feature 228 includes cobalt; tungsten; ruthenium; copper; Co, W, Ru or Cu-based compound or alloy doped with other element, such as Zr, Sn, Ag, Cu, Au, Al, Ca, Be, Mg, Rh, Na, Jr, W, Mo, Zn , Ni, K , Co, Cd , Ru, In, Os , Si, Ge, Mn; or other suitable conductive material. The top metal feature 228 may have a thickness ranging between 5 nm and 500 nm. The top metal feature 228 may be formed by a procedure that includes deposition and CMP. Alternatively, be formed by bottom deposition. The thickness Tt of the top metal feature 228 and the thickness Tb of the bottom metal feature 224 are collectively controlled in a proper range such that various factors are balanced for optimized structure and performance. If the bottom metal feature 224 is too thin, the top metal feature 228 has a filling issue due to high aspect ratio. If the bottom metal feature 224 is too thick, the overall resistance is substantially increased. In the present embodiment, the ratio of Tb/Tt is tuned in a range between 0.5 and 1.5.

FIGS. 4 through 8 are cross-sectional views of the semiconductor device structure 100 at various fabrication stages constructed in accordance with some embodiments. FIG. 9 is a flowchart of a method 900 making the semiconductor device structure 100, especially the multi-deck conductive feature 122. The formation of the multi-deck conductive feature 122 is further described in detail with reference to FIGS. 4 through 9.

Referring to FIG. 9, the method 900 includes an operation 920 to form the multi-deck conductive feature 122, which further includes sub-operations 932 through 940. The method 900 may further include operations before, during or after the operation 920 to form the multi-deck conductive feature 122. For example, the method 900 includes operations 902 through 914 to form fin active regions 104, the isolation features 106, the S/D features 114, and the metal gate stacks during the FEOL process. The method 900 also includes operations 916 and 918 to form contact features 210 and the via features 214 during the MEOL process. The method 900 also includes other operations, such as 922 to form other conductive features of the interconnect structure 120 during the BEOL process, which include metal lines in various metal layers (such as $M_1$, $M_2$, $M_3$, and etc.) and via features between adjacent metal layers using a proper technique, such as dual damascene process. Especially, the method includes an operation 920 to form the multi-deck conductive feature 122, which further includes sub-operations 932 through 940, described below.

Figure 4:
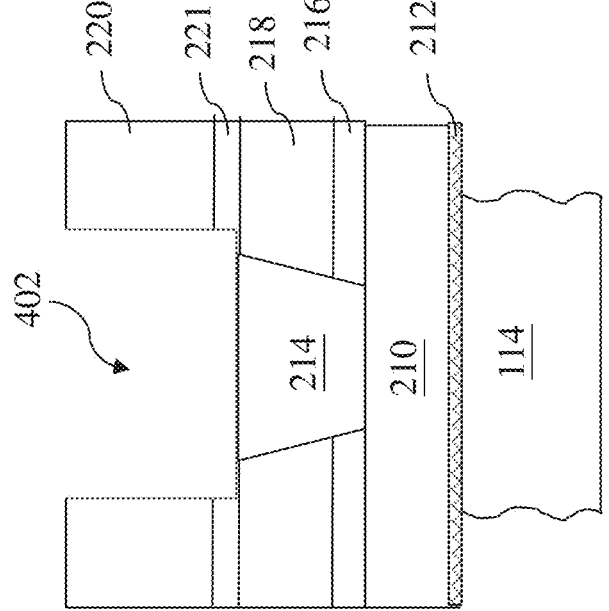
FIGS. 4, 5, 6, 7, and 8 show cross-sectional views of the semiconductor device structure, in accordance with an embodiment.
Figure 4:
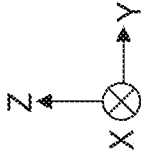

Referring to FIG. 4, the method 900 includes an operation 932 by forming a trench 402 in the ILD layer 220 by lithography process and etching. The underlying conductive feature, such as via feature 214 is exposed within the trench 402. The trench 402 may have a width ranging between 5 nm and 400 nm. The operation 932 may further use a hard mask for patterning. In this case, a hard mask is deposited on the ILD layer 220; a patterned resist layer is formed on the hard mask by a lithography process; an etching process is applied to transfer the openings of the patterned resist layer to the hard mask; and another etching process is applied to the ILD layer 220 to form the trench 402. The hard mask may be removed thereafter.

Figure 5:
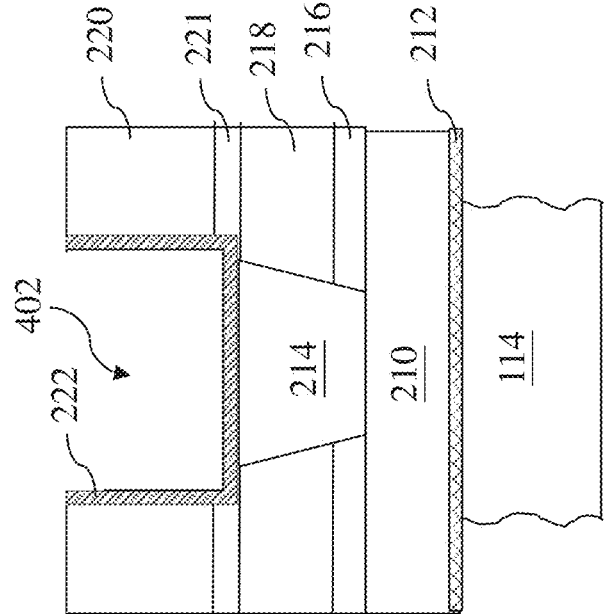
Figure 5:
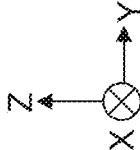

Referring to FIG. 5, the method 900 includes an operation 934 by forming a barrier layer 222 in the trench 402 using a proper deposition, such as ALD, PVD or CVD. The barrier layer 222 may also be deposited on the top surface of the ILD layer 220 but will be removed at later stage, such as CMP.

Figure 6:
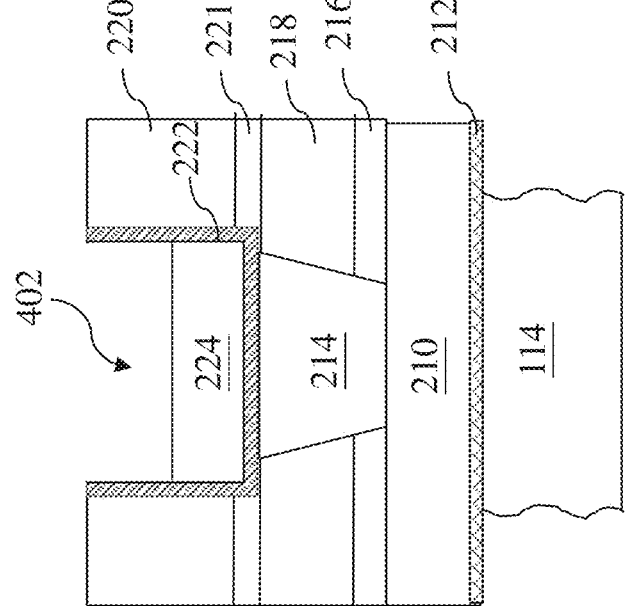
Figure 6:
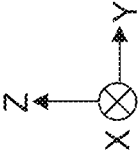

Referring to FIG. 6, the method 900 includes an operation 936 by forming the bottom metal feature 224 in the trench 402 using a proper technique, such as a procedure that includes deposition, CMP and etch-back. In the present embodiment, the metal of the bottom metal feature 224 is deposited on the barrier layer 222 to fill the trench 402 by a suitable deposition technique, such as ALD, PVD or CVD. Alternatively, a seed layer is formed on the barrier layer 222 by ALD, PVD or CVD, then a plating process is applied to fill the trench 402. Then a CMP process is applied to remove the excessive metal on the top of the ILD layer 220 and may additionally remove the barrier layer 222 deposited on the top surface of the ILD layer 220. An etch-back process is thereafter applied to selectively recess the bottom metal feature 224 to a desired height, such as a height ranging between 5 nm and 450 nm. In some embodiments, the etch-back process includes a wet digital etch, in which oxidation and etch are alternately applied multiple cycles to reach etch back depth target. In some embodiments, the etch-back process includes dry etch to selectively remove the bottom metal feature 224 with etch selectivity relative to the ILD layer 220. In furtherance of the embodiments, the dry etch uses atomic layer etch gas dosing and ion bombardment to remove the bottom metal feature 224 for controlling the etch back depth.

Figure 7:
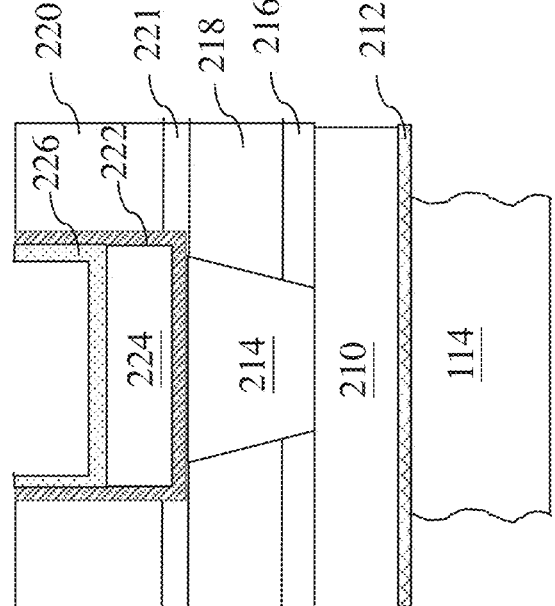
Figure 7:
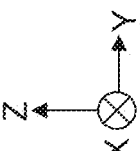

Referring to FIG. 7, the method 900 includes an operation 938 by forming the liner 226 on the bottom metal feature 224 and on the sidewalls of the barrier layer 222. The liner 226 has a better adhesion than the barrier layer 222, therefore providing a wetting surface and adhesion strength for the top metal feature. The liner 226 may be formed by ALD, PVD, CVD or other suitable deposition technique.

Figure 8:
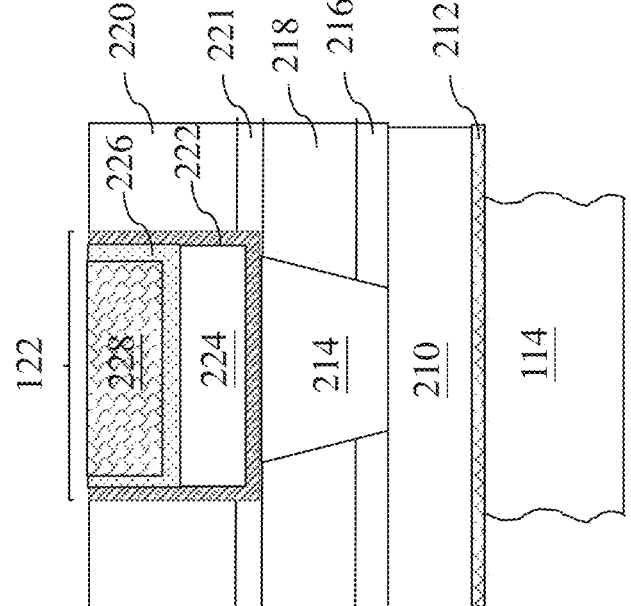
Figure 8:
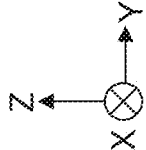

Referring to FIG. 8, the method 900 includes an operation 940 by forming the top metal feature 228 on the liner to fill the trench 402 using a proper deposition, such as ALD, PVD, CVD, plating, other suitable deposition or a combination thereof. For example, a seed layer may be deposited in the trench 402 and then a plating process is applied to deposit the top metal feature on the seed layer to fill the trench 402. A CMP process may be further applied to remove the excessive metal and planarize the top surface.

In the present embodiment, such formed multi-deck conductive feature 122 is electrically connected to the S/D feature 114. Alternatively, the multi-deck conductive feature 122 is configured to be electrically connected to the gate electrode 110 of the high-k metal gate stack through the via feature 214. In some other embodiments, the structure and method of the multi-deck conductive feature 122 may be applied to form other portions of the interconnect structure 120, such as via features or metal lines in the overlying metal layer. In other embodiments, the multi-deck conductive feature 122 may be used in a semiconductor device structure having vertically stacked channels, such as a gate-all-around (GAA) structure.

The present disclosure provides a semiconductor device structure having a multi-deck conductive feature 122 and a method making the same. By implementing the disclosed semiconductor device structure 100 and the method 900 in various embodiments, some of advantages described below may present. However, it is understood that different embodiments disclosed herein offer different advantages and that no particular advantage is necessarily required in all embodiments. Such formed multi-deck conductive feature 122 provides more freedom to optimize the gap filling and conductivity, respectively. If the conductive feature 122 has one metal feature extending from the top to the bottom, instead of the top metal feature 228 and the bottom metal feature 224, it will suffer poor gap filling issue and also increases the resistance and introduces other issues, such as reliability due to high aspect-ratio gap when the pitch is scaling down to the advanced technology nodes. More specifically, if copper is used to form a single-deck conductive feature extending from the top to the bottom, the poor gap filling causes gap filling issue and eventually void and increased resistance. If cobalt is used to form a single-deck conductive feature extending from the top to the bottom, the cobalt has improved gap filling but higher resistivity than copper, eventually increasing the resistance of the conductive feature. The multi-deck conductive feature provides freedom to separately choose the material of the bottom metal feature 224 with higher gap filling capability and choose the material of the top metal feature 228 with lower resistivity. Furthermore, the barrier layer 222 and the liner 226 are also separated with different compositions tuned to maximize respective functions: barrier to diffusion and adhesion strength. The barrier layer 222 is surrounding both the top metal feature 228 and the bottom metal feature 224 while the liner 226 is only surrounding the top metal feature 228 to enhance the adhesion and gap filling of the top metal feature 228.

In one example aspect, the present disclosure provides a semiconductor device structure. The semiconductor device structure includes: a fin active region extruded above a semiconductor substrate; a gate stack disposed on the fin active region, wherein the gate stack includes a gate dielectric layer and a gate electrode; source/drain (S/D) features formed on the fin active region and interposed by the gate stack; and a conductive feature electrically connected to one of the gate electrode and the S/D features. The conductive feature includes a bottom metal feature of a first metal; a top metal feature of a second metal over the bottom metal feature, wherein the second metal is different from the first metal in composition; a barrier layer surrounding both the top metal feature and the bottom metal feature; and a liner surrounding the top metal feature and separating the top metal feature from the bottom metal feature and the barrier layer.

In another example aspect, the present disclosure provides a method of semiconductor device structure fabrication. The method includes: forming a trench in a dielectric layer on a semiconductor substrate, forming a barrier layer on sidewalls and a bottom surface of the trench; forming a bottom metal feature of a first metal on the barrier layer, wherein the bottom metal feature is formed on a bottom portion of the trench; depositing a liner on the bottom metal feature and sidewalls of the barrier layer; and forming a top metal feature of a second metal on the liner, wherein the top metal feature fills the trench, and wherein the second metal is different from the first metal in composition.

In yet another example aspect, the present disclosure provides a semiconductor device structure. The semiconductor device structure includes: a semiconductor substrate having an active region; a gate stack disposed on the active region, wherein the gate stack includes a gate dielectric layer and a gate electrode; a source/drain (S/D) feature formed on the active region and disposed on an edge of the gate stack; and a conductive feature electrically connected to one of the gate electrode and the S/D features. The conductive feature includes a bottom metal feature of a first metal; a top metal feature of a second metal over the bottom metal feature, wherein the second metal is different from the first metal in composition; and a barrier layer surrounding both the top metal feature and the bottom metal feature, wherein the liner separates the top metal feature from the bottom metal feature and the barrier layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a fin active region extruded above a semiconductor substrate;
a gate stack disposed on the fin active region, wherein the gate stack includes a gate dielectric layer and a gate electrode;
source/drain (S/D) features formed on the fin active region and interposed by the gate stack; and
a conductive feature electrically connected to one of the S/D features, wherein the conductive feature includes:
a bottom metal feature of a first metal;
a top metal feature of a second metal over the bottom metal feature, wherein the second metal is different from the first metal in composition, and wherein the first metal is cobalt and the second metal is copper;
a barrier layer surrounding both the top metal feature and the bottom metal feature; and
a liner of the first metal surrounding the top metal feature and separating the top metal feature from the bottom metal feature and the barrier layer, wherein the barrier layer and the liner are different in composition.

2. The semiconductor device structure of claim 1, wherein the barrier layer includes tantalum nitride.

3. The semiconductor device structure of claim 1, wherein the liner includes a bottom surface spanning a first width and the bottom metal feature includes a top surface spanning a second width being equal to the first width, and wherein the bottom surface of the liner is fully aligned with the top surface of the bottom metal feature.

4. The semiconductor device structure of claim 1, further comprising a contact feature landing on one of the S/D features, wherein the conductive feature is electrically connected to the contact feature.

5. The semiconductor device structure of claim 4, further comprising a via feature landing on the contact feature, wherein the conductive feature is landing on the via feature.

6. The semiconductor device structure of claim 1, wherein the second metal has a conductivity greater than that of the first metal.

7. The semiconductor device structure of claim 1,
   wherein the conductive feature is embedded within a first interlayer dielectric (ILD) layer having a first etch stop layer and a first low-k dielectric layer over the first etch stop layer,
   wherein the barrier layer lands on a top surface of a second ILD layer having a second etch stop layer and a second low-k dielectric layer over the second etch stop layer.

8. A semiconductor device structure, comprising:
   a semiconductor substrate having an active region;
   a gate stack disposed on the active region, wherein the gate stack includes a high-k gate dielectric layer and a metal gate electrode;
   a source/drain (S/D) feature formed on the active region and disposed on an edge of the gate stack;
   a conductive via landing on the metal gate electrode; and
   a conductive feature landing on the conductive via and electrically connected to the metal gate electrode, wherein the conductive feature includes:
      a bottom metal feature of a first metal that includes cobalt;
      a top metal feature of a second metal that includes copper over the bottom metal feature, wherein the second metal is different from the first metal in composition;
      a barrier layer directly contacting a bottom surface of the bottom metal feature; and
      a liner layer of the first metal that includes cobalt directly contacting a top surface of the bottom metal feature and directly contacting a bottom surface of the top metal feature,
      wherein a portion of the liner layer is disposed between the top metal feature and the barrier layer.

9. The semiconductor device structure of claim 8, wherein the liner and the barrier layers are different in composition.

10. The semiconductor device structure of claim 9, wherein the barrier layer includes tantalum nitride.

11. The semiconductor device structure of claim 9, wherein the first metal has a smaller electrical conductivity than the second metal.

12. The semiconductor device structure of claim 8, wherein the gate stack further includes a capping layer over the high-k gate dielectric layer, a work function layer over the capping layer, and a seed layer over the work function layer, wherein the metal gate electrode is formed over the seed layer.

13. The semiconductor device structure of claim 8, wherein the top metal feature as a greater thickness than the bottom metal feature.

14. A semiconductor device structure, comprising:
   a semiconductor substrate having an active region;
   a gate stack disposed on the active region, wherein the gate stack includes a gate dielectric layer and a gate electrode;
   a source/drain (S/D) feature formed on the active region and disposed on an edge of the gate stack; and
   a conductive feature electrically connected to the S/D features, wherein the conductive feature is embedded within a first interlayer dielectric (ILD) layer having a first etch stop layer and a first low-k dielectric layer over the first etch stop layer, the conductive feature includes:
      a bottom metal feature of a first metal that includes cobalt;
      a top metal feature of a second metal that includes copper over the bottom metal feature, wherein the second metal is different from the first metal in composition;
      a barrier layer surrounding both the top metal feature and the bottom metal feature, wherein the barrier layer is in direct contact with the bottom metal feature without directly contacting the top metal feature, wherein the barrier layer lands on a top surface of a second ILD layer having a second etch stop layer and a second low-k dielectric layer over the second etch stop layer; and
      a liner of the first metal that includes cobalt surrounding the top metal feature, wherein the barrier layer surrounds the liner and the bottom metal feature, wherein the barrier layer and the liner are different in composition.

15. The semiconductor device structure of claim 14, wherein a conductivity of the second metal is greater than that of the first metal.

16. The semiconductor device structure of claim 14, wherein the barrier layer includes tantalum nitride.

17. The semiconductor device structure of claim 14, wherein the liner includes a bottom surface spanning a first width and the bottom metal feature includes a top surface spanning a second width being equal to the first width, and wherein the bottom surface of the liner is fully aligned with the top surface of the bottom metal feature.

18. The semiconductor device structure of claim 14, wherein
   the bottom metal feature has a thickness ranging between 5 nm and 450 nm;
   the top metal feature has a thickness ranging between 5 nm and 450 nm;
   the liner has a thickness ranging between 0.5 nm and 5 nm; and
   the conductive feature has a width ranging between 5 nm and 400 nm.

19. The semiconductor device structure of claim 14, wherein
   the top metal feature has a thickness Tt;
   the bottom metal feature has a thickness Tb; and
   a ratio of Tb/Tt ranges between 0.5 and 1.5.

20. The semiconductor device structure of claim 14, further comprising:
   silicide features on the S/D features; and a metal contact on the silicide features, wherein the conductive feature lands on the metal contact, and the metal contact includes a barrier layer, a seed layer, and a fill layer, wherein the seed layer surrounds outer surfaces of the fill layer, and the barrier layer surrounds outer surfaces of the seed layer.

5

\* \* \* \* \*